(12) United States Patent
Wang et al.

(10) Patent No.: US 10,192,902 B2
(45) Date of Patent: Jan. 29, 2019

(54) LTPS ARRAY SUBSTRATE

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventors: Cong Wang, Guangdong (CN); Peng Du, Guangdong (CN); Xiaoxiao Wang, Guangdong (CN)

(73) Assignees: Shenzhen China Star Optoelectronics Technology Co., Ltd, Shenzhen, Guangdong (CN); Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 0 days.

(21) Appl. No.: 15/853,832

(22) Filed: Dec. 24, 2017

(65) Prior Publication Data

US 2018/0122829 A1 May 3, 2018

Related U.S. Application Data

(62) Division of application No. 14/779,089, filed on Sep. 22, 2015, now Pat. No. 9,905,590.

(51) Int. Cl.
*H01L 27/12* (2006.01)
*G02F 1/1368* (2006.01)
*H01L 29/786* (2006.01)

(52) U.S. Cl.
CPC .......... *H01L 27/127* (2013.01); *G02F 1/1368* (2013.01); *H01L 27/1222* (2013.01); *H01L 27/1248* (2013.01); *H01L 27/1288* (2013.01); *H01L 29/78621* (2013.01); *H01L 29/78675* (2013.01); *G02F 2202/104* (2013.01)

(58) Field of Classification Search
CPC ... H01L 27/12; H01L 27/127; H01L 27/1222; H01L 27/1288
See application file for complete search history.

(56) References Cited

U.S. PATENT DOCUMENTS

| 5,122,474 A * | 6/1992 | Harrington, III ............... H01L 21/823807 257/E21.433 |
| 6,650,389 B1 * | 11/2003 | Sakamoto ......... G02F 1/134363 349/111 |
| 2007/0222907 A1 * | 9/2007 | Onogi ............... G02F 1/134363 349/42 |

(Continued)

*Primary Examiner* — Phuc Dang
(74) *Attorney, Agent, or Firm* — Andrew C. Cheng

(57) ABSTRACT

A method for manufacturing a LTPS array substrate includes: forming a source electrode and a drain electrode on a substrate, forming a poly-silicon layer in a first region and a second region of the substrate including the source electrode and the drain electrode, such that the poly-silicon layer of the first region has a thickness greater than that of the second region and the poly-silicon layer of the first region partially covers the source electrode and the drain electrode; passivating a surface of the poly-silicon layer in order to turn a part of the poly-silicon layer of the second region and the first region that is adjacent to the surface into an insulating layer; and forming a gate electrode on the insulating layer between the source electrode and the drain electrode. The LTPS technical process is simple and can reduce the producing costs.

2 Claims, 3 Drawing Sheets

(56) References Cited

U.S. PATENT DOCUMENTS

2010/0002173 A1* 1/2010 Otani ................ G02F 1/133555
  349/114
2013/0321726 A1* 12/2013 Lee .................... H01L 27/3265
  349/38

* cited by examiner

LTPS ARRAY SUBSTRATE

CROSS REFERENCE TO RELATED APPLICATIONS

This is a divisional application of patent application Ser. No. 14/779,089, filed on Sep. 22, 2015, now U.S. Pat. No. 9,905,590, which is a national stage of PCT Application Number PCT/CN2015/085660, filed on Jul. 31, 2015, claiming foreign priority of Chinese Patent Application Number 201510443670.5, filed on Jul. 24, 2015.

BACKGROUND OF THE INVENTION

1. Field of the Invention

The present invention relates to a display technical field, and more particular to a LTPS (Low Temperature Poly-Silicon) array substrate and a manufacturing method thereof.

2. The Related Arts

Because a liquid crystal display device using LTPS technology has higher electron mobility, it can effectively reduce a thin film transistor (TFT) area to improve the aperture ratio of the pixel, and also can reduce power consumption and producing costs, while enhancing display brightness, so that it has become a research hotspot currently in the field of liquid crystal display. However, the LTPS technology is complicated and the number of layers of the array substrate adopting chemical vapor deposition (CVD) is more, resulting in numerous manufacturing processes. The producing costs cannot be reduced. Therefore, how to simplify the LTPS technology process is really the goal of the current enterprise.

SUMMARY OF THE INVENTION

In view of this, embodiments of the present invention provide a LTPS array substrate and a manufacturing method thereof, which help simplify the LTPS technology process.

An embodiment of the present invention provides a manufacturing method of a LTPS array substrate, which comprises: forming a source electrode and a drain electrode of a TFT of said LTPS array substrate on a substrate; forming poly-silicon layers of a first region and a second region on said substrate including said source electrode and said drain electrode, and the width of said poly-silicon layer of said first region being greater than said second region, said poly-silicon layer of said first region except said second region partially covering said source electrode and said drain electrode; passivating the surface of said poly-silicon layer, in order to transform the portion adjacent to the surface of said poly-silicon layer of said second region and said poly-silicon layer of said first region into insulating layer, wherein said passivation comprises at least one of an oxidation treatment and the nitriding treatment; forming a gate electrode of said TFT on said insulating layer between said source electrode and said drain electrode; injecting P-type impurity ions into the both ends where said poly-silicon layer of said first region directly contacts with said source electrode and said drain electrode, in order to form a LDD structure; forming a planar layer on said substrate including said gate electrode, and forming a contact hole in said planar layer in order to expose the surface of said drain electrode; forming a common electrode layer of said LTPS array substrate on said planar layer except for corresponding to said TFT; forming a passivation layer on said planar layer and said common electrode layer, and said passivation layer being not covered with said contact hole; forming a pixel electrode on said passivation layer, and said pixel electrode could be electrically connected with said drain electrode through said contact hole.

The substrate comprises a backing plate and a buffer layer formed on said backing plate.

Said steps of forming poly-silicon layers of a first region and a second region on said substrate including said source electrode and said drain electrode comprise: sequentially forming a poly-silicon layer and a positive photoresist layer on said substrate including said source electrode and said drain electrode; using a half-transparent photo-mask to expose from the side that said substrate towards said positive photoresist layer, in order to forming the positive photoresist layers of the first region and the second region of which the thicknesses are different; removing said positive photoresist layer of the second region; etching said poly-silicon layer of the second layer so that it has predetermined thickness; removing said positive photoresist layer of the first region.

Another embodiment of the present invention provides a manufacturing method of a LTPS array substrate, which comprises: forming a source electrode and a drain electrode of a TFT of said LTPS array substrate on a substrate; forming poly-silicon layers of a first region and a second region on said substrate including said source electrode and said drain electrode, and the width of said poly-silicon layer of said first region being greater than said second region, said poly-silicon layer of said first region except said second region partially covering said source electrode and said drain electrode; passivating the surface of said poly-silicon layer, in order to transform the portion adjacent to the surface of said poly-silicon layer of said second region and said poly-silicon layer of said first region into insulating layer; forming a gate electrode of said TFT on said insulating layer between said source electrode and said drain electrode.

The substrate comprises a backing plate and a buffer layer formed on said backing plate.

Said steps of forming poly-silicon layers of a first region and a second region on said substrate including said source electrode and said drain electrode comprise: sequentially forming a poly-silicon layer and a positive photoresist layer on said substrate including said source electrode and said drain electrode; using a half-transparent photo-mask to expose from the side that said substrate towards said positive photoresist layer, in order to forming the positive photoresist layers of the first region and the second region of which the thicknesses are different; removing said positive photoresist layer of the second region; etching said poly-silicon layer of the second layer so that it has predetermined thickness; removing said positive photoresist layer of the first region.

Said passivation comprises at least one of an oxidation treatment and the nitriding treatment.

After forming said gate electrode on said insulating layer between said source electrode and said drain electrode, said method further comprises: injecting first impurity ions into the both ends where said poly-silicon layer of said first region directly contacts with said source electrode and said drain electrode; injecting second impurity ions into said poly-silicon layer of said first region corresponding to where are between said gate electrode and said source electrode as well as said gate electrode and said drain electrode, in order to form a LDD structure.

After forming said LDD structure, said method further comprises: forming a planar layer on said substrate including said gate electrode, and forming a contact hole in said planar layer in order to expose the surface of said drain electrode; forming a common electrode layer of said LTPS array substrate on said planar layer except for corresponding to said TFT; forming a passivation layer on said planar layer and said common electrode layer, and said passivation layer being not covered with said contact hole; forming a pixel electrode on said passivation layer, and said pixel electrode could be electrically connected with said drain electrode through said contact hole.

Said first impurity ion is a N+ type impurity ion, and said second impurity ion is a N− type impurity ion.

After forming said gate electrode on said insulating layer between said source electrode and said drain electrode, said method further comprises: injecting P-type impurity ions into the both ends where said poly-silicon layer of said first region directly contacts with said source electrode and said drain electrode, in order to form a LDD structure.

After forming said LDD structure, said method further comprises: forming a planar layer on said substrate including said gate electrode, and forming a contact hole in said planar layer in order to expose the surface of said drain electrode; forming a common electrode layer of said LTPS array substrate on said planar layer except for corresponding to said TFT; forming a passivation layer on said planar layer and said common electrode, and said passivation layer being not covered with said contact hole; forming a pixel electrode on said passivation layer, and said pixel electrode could be electrically connected with said drain electrode through said contact hole.

Another embodiment of the present invention provides a LTPS array substrate, which comprises: a substrate; a source electrode and a drain electrode, which are located on said substrate; a poly-silicon layer, which is located on said substrate including said source electrode and said drain electrode, and said poly-silicon layer partially covering said source electrode and said drain electrode; an insulating layer, which is located on said poly-silicon layer as well as said source electrode and said drain electrode, and said insulating layer being obtained by passivation of said poly-silicon layer covering on said substrate including said source electrode and said drain electrode; a gate electrode, which is located on said insulating layer between said source electrode and said drain electrode; a planar layer, which is located on said substrate including said gate electrode, and inside said planar layer forming a contact hole exposing the surface of said drain electrode; a common electrode, which is located on said planar layer except TFT corresponding to said LTPS array substrate; a passivation layer, which is located on said planar layer and said common electrode layer, and said passivation layer does not cover said contact hole; a pixel electrode, which is located on said passivation layer, and said pixel electrode could be electrically connected with said drain electrode through said contact hole.

Said passivation comprises at least one of an oxidation treatment and the nitriding treatment.

The LTPS array substrate and the manufacturing method thereof in the embodiments of the present invention, through the way passivating the surface of the poly-silicon layer, there is no need to adopt CVD technology to obtain the insulating layer between the gate electrode and the source electrode as well as the drain electrode, comparing to LTPS technology process and reduce the producing costs.

DETAILED DESCRIPTION OF PREFERRED EMBODIMENTS

The following will combine the drawings of the embodiment of the present invention to clearly and completely describe the technical solution of the exemplary embodiments provided by the present invention.

Figure 1:
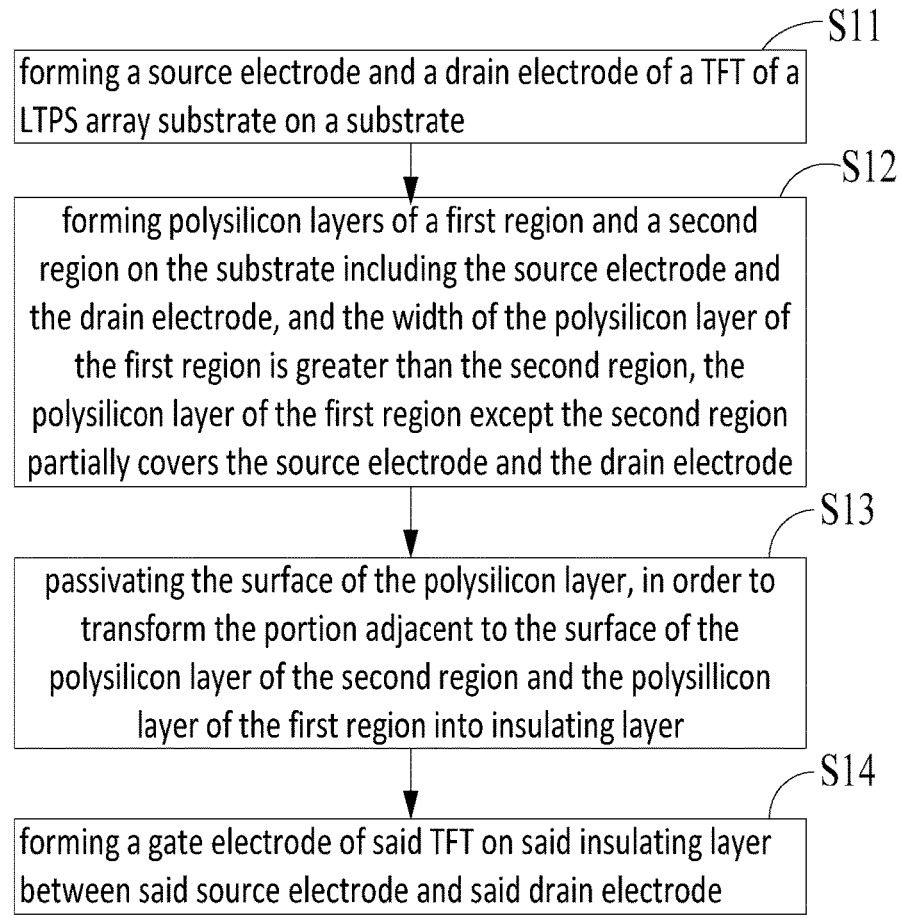
FIG. 1 is a flow chart of a manufacturing method of a LTPS array substrate of an embodiment of the present invention.

FIG. 1 is a flow chart of a manufacturing method of a LTPS array substrate of an embodiment of the present invention. As shown in FIG. 1, the manufacturing method of the present invention comprises the following steps:

Step 11: forming a source electrode and a drain electrode of a TFT of the LTPS array substrate on a substrate.

Figure 2:
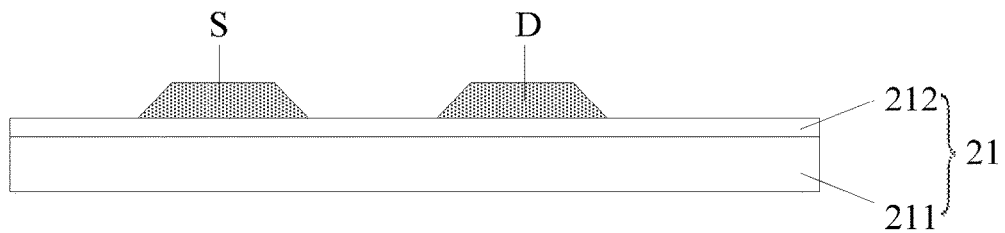
FIG. 2 is a schematic diagram of forming a source electrode and a drain electrode of a manufacturing method of the present invention.

The substrate that is used to form the LTPS array substrate of the liquid crystal display panel, could be a glass substrate, a plastic substrate or a flexible substrate. As shown in FIG. 2, the substrate 21 may alternatively comprise a backing plate 211 and a transparent buffer layer 212 formed on the backing plate 211. The buffer layer 212 can be a SiNx layer, a SiOx layer, or a combination thereof. The buffer layer 212 prevents impurities contained in the backing plate 211 from diffusing upward in the subsequent process and affecting the quality of a low-temperature poly-silicon thin film formed subsequently. The SiNx layer and the SiOx layer could be formed by adopting CVD technology or plasma enhanced chemical vapor deposition (PECVD) technology, and may alternatively be formed by adopting methods, such as sputtering, vacuum deposition, and low pressure chemical vapor deposition, but not limited thereto.

The present embodiment can use a first photo mask to expose the first metal layer formed on the substrate 21, and patterning processes, such as development and etching, are carried out after the exposure in order to form a source electrode S and a drain electrode D, wherein an etching liquid comprising phosphoric acid, nitric acid, acetic acid and deionized water can be used to etch the first metal layer and alternatively and certainly, dry etching could also be used. The first metal layer can be formed of a metal, such as aluminum, molybdenum, titanium, chromium, and copper, or a metal oxide, such as titanium oxide, a metal alloy, or other conductive materials.

Certainly, the present embodiment could also obtain the source electrode S and the drain electrode D of the TFT through other ways, such as adopting CVD technology, PECVD technology, sputtering, vacuum deposition or low pressure chemical vapor deposition and so on to directly form the source electrode S and the drain electrode D having a predetermined pattern on the substrate 21.

Step 12: forming poly-silicon layers of a first region and a second region on the substrate including the source electrode and the drain electrode, wherein the poly-silicon layer of the first region has a width that is greater than a width of the poly-silicon layer of the second region and the poly-silicon layer of the first region, except the second region, partially covers the source electrode and the drain electrode.

Figure 3:
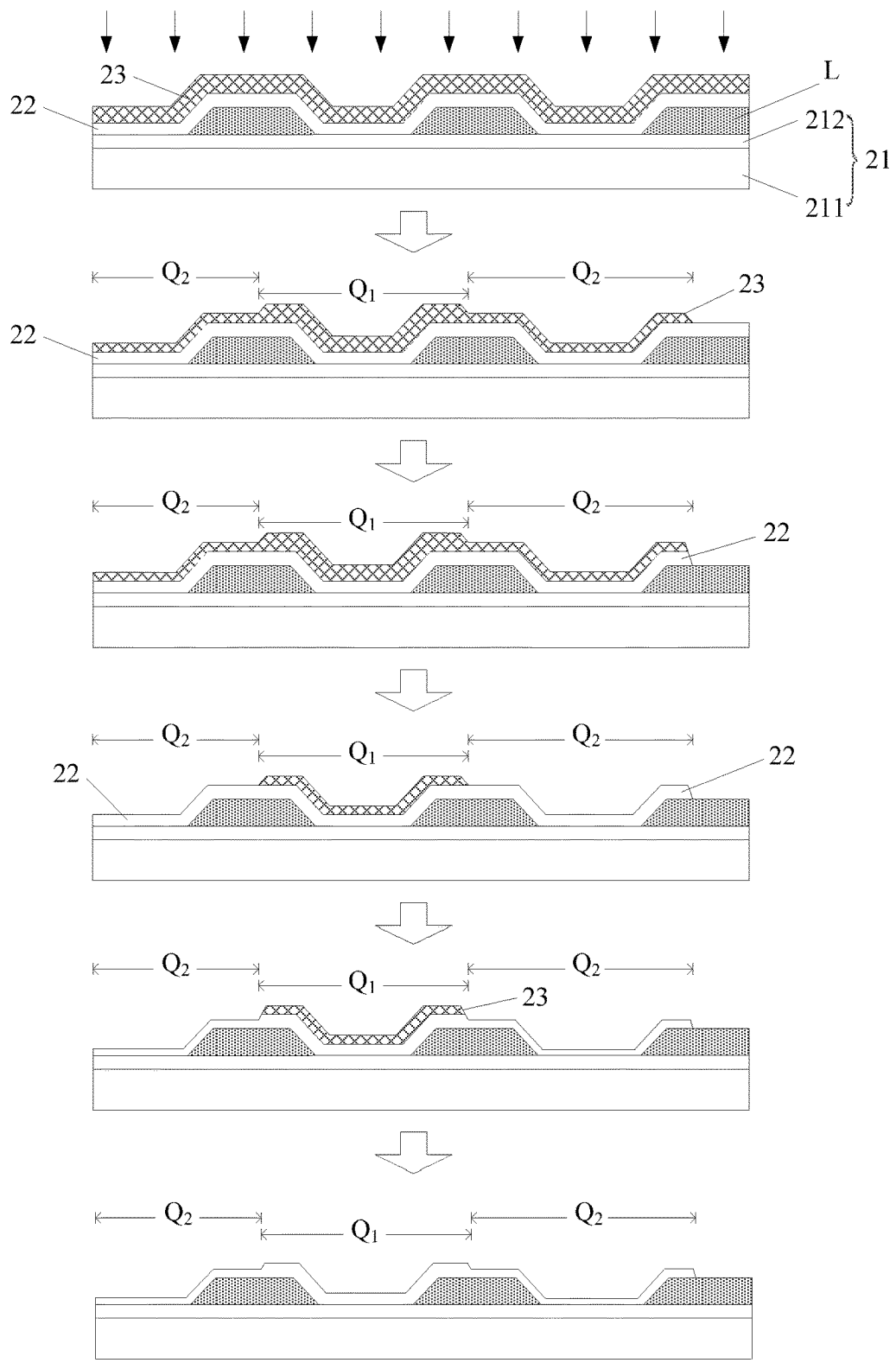
FIG. 3 is a schematic diagram of forming a poly-silicon layer of a manufacturing method of the present invention.

Referring also to FIG. 3, a specific process of forming the poly-silicon layer 22 of the first region $Q_1$ and the poly-silicon layer 22 of the second region $Q_2$ comprises, but is not limited to, the following steps:

Firstly, a semiconductor layer is formed on the substrate 21 including the source electrode S and the drain electrode D, wherein the semiconductor covers not only the source electrode S and the drain electrode D and a metal trace L, but also the whole upper surface of the substrate 21, and then, the semiconductor layer is subjected to excimer laser annealing (ELA) to obtain a whole surface of the poly-silicon layer 22, wherein the poly-silicon layer 22 not only covers the source electrode S and the drain electrode D, but also the whole upper surface of the substrate 21, and then, a positive photoresist layer 23 is formed on the poly-silicon layer 22.

Afterward, a half-tone mask is used to carry out exposure on a side of the substrate 21 towards the positive photoresist layer 23 (as indicated by an arrow shown in the drawings), wherein the exposure intensity of the positive photoresist layer 23 in the first region $Q_1$ is greater than the exposure intensity in the second region $Q_2$, thereby making the positive photoresist layer 23 that is originally of a uniform thickness become a positive photoresist layer 23 having a variable thickness.

Next, the exposed positive photoresist layer 23 is subjected to development. In this step of the present embodiment, a part of the positive photoresist layer 23 on a top of metal trace L could be eliminated through the development in order to expose the poly-silicon layer 22 located thereunder. A part of the poly-silicon layer 22 on the top of the metal trace L could then be eliminated through an etching process in order to expose the metal trace L located thereunder, wherein the metal trace L is used to achieve connection between the TFT and signal lines of the LTPS array substrate, such as a scan line, a data line and so on.

Then, the positive photoresist layer 23 in the second region $Q_2$ is eliminated through an ashing process, wherein the thickness of the poly-silicon layer 22 after the ashing process is less than the thickness before the ashing process. The present step can eliminate the positive photoresist 23 of the second region $Q_2$ to expose the poly-silicon layer 22 corresponding to the second region $Q_2$ without using a photo mask. Compared to the prior art, the present embodiment can reduce the amount of photo masks involved in the LTPS technology.

Furthermore, the exposed portion of the poly-silicon layer corresponding to the second region $Q_2$ is subjected to etching to in order to reduce the thickness thereof to a predetermined thickness suit to producing requirement.

Finally, the positive photoresist layer 23 in the first region $Q_1$ is eliminated.

Step 13: carrying out passivation on a surface of the poly-silicon layer, in order to turn portions of the poly-silicon layer of the second region and the poly-silicon layer of the first region that are adjacent to the surface into insulating layers.

Figure 4:
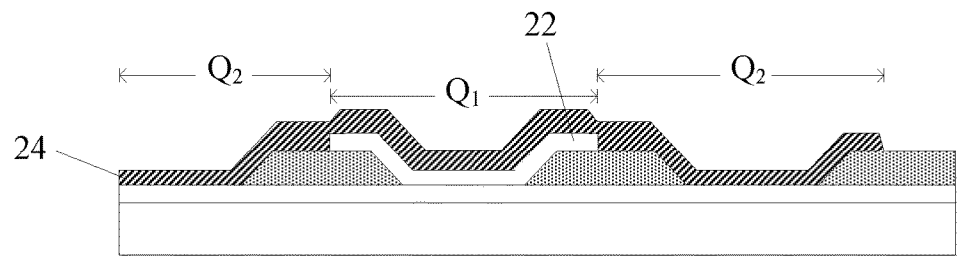
FIG. 4 is a schematic diagram of forming an insulating layer of a manufacturing method of the present invention.

Referring also to FIG. 4, the passivation could be oxidation treatment, and specifically, the oxidation treatment is carried out on the surface of the poly-silicon layer 22 of the first region $Q_1$ and the second region $Q_2$ by adopting $O_2$ plasma in order to generate SiOx, so that the whole poly-silicon layer 22 of the first region $Q_1$ becomes SiOx, and an upper half-layer of the poly-silicon layer 22 of the second region $Q_2$ becomes SiOx and a lower half-layer will not turn into SiOx because of being shielded by the upper half-layer so as to remain a poly-silicon layer 22. The SiOx part serves as an insulating layer 24, which is often referred to as a gate-insulating layer. Compared to the traditional CVD technology, passivation is a much easier process, so that the whole process of the LTPS technology can be simplified and the producing costs can be reduced.

The passivation could alternatively be nitriding treatment, making the whole poly-silicon layer 22 of first region $Q_1$ become SiNx, and making the upper half-layer of the poly-silicon layer 22 of the second region $Q_2$ become SiNx and the lower half-layer still remains a poly-silicon layer 22. The SiNx part formed by means of nitriding treatment may serve as the insulating layer 24. Certainly, the passivation process could also be a combination of oxidation treatment and nitriding treatment.

Step 14: forming a gate electrode of TFT on the insulating layer between the source electrode and the drain electrode.

Figure 5:
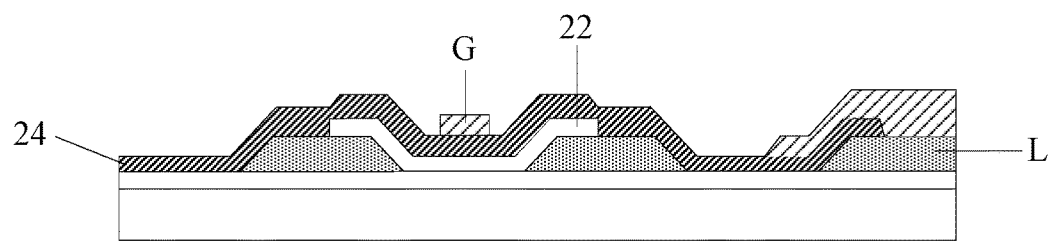
FIG. 5 is a schematic diagram of forming a gate electrode of a manufacturing method of the present invention.

Referring also to FIG. 5, the present embodiment can expose the second metal layer formed on the insulating layer 24 between the source electrode S and the drain electrode D by using a second photo mask, and further carrying out patterning processes of development and etching after exposing in order to obtain a gate electrode G, wherein an etching liquid comprising phosphoric acid, nitric acid, acetic acid and deionized water can be used to etch the second metal layer, or alternatively, dry etching can be adopted instead. Certainly, it can alternatively adopt other processes, such as CVD technology, PECVD technology, sputtering, vacuum deposition or low pressure chemical vapor deposition to directly form the gate electrode G having a predetermined pattern on the insulating layer 24.

A metal layer can be formed on the top of the metal trace L at the same time of forming the gate electrode G, thereby making the metal trace L able to electrically connect with a common electrode that is subsequently formed.

After the gate electrode is formed, the present embodiment further adopts treatment applied to the poly-silicon layer 22 in order to provide the TFT with a lightly doped drain (LDD) structure. Specifically, first impurity ions are injected into the two ends of poly-silicon layer 22 of the first region $Q_1$ that are in direct contact with the source electrode S and the drain electrode D, this being a process of heavily doping in the traditional sense to the poly-silicon layer 22 of the first region $Q_1$, so as to provide ohmic contacts between the source S electrode and the drain electrode D with the poly-silicon layer 22 of the first region $Q_1$. The gate electrode G is then etched, in order to reduce the thickness thereof and expose the poly-silicon layer 22 below corresponding to the location between the gate electrode G and the source electrode S and the location between the gate electrode G and the drain electrode D. Second impurity ions are injected into the poly-silicon layer 22 of the first region $Q_1$ at locations corresponding to that between the gate electrode G and the source electrode S and that between the gate electrode G and the drain electrode D, this being a process of lightly doping in the traditional sense to the poly-silicon layer 22 of the first region $Q_1$, thereby forming a LDD structure.

The first impurity ion could be N+ type impurity ion, and correspondingly, the second impurity ion could be N− type impurity ion, but there is no need to dope the second impurity ions when the first impurity ion is P+ type impurity ion, namely, the step of the lightly doping process is omitted.

Figure 6:
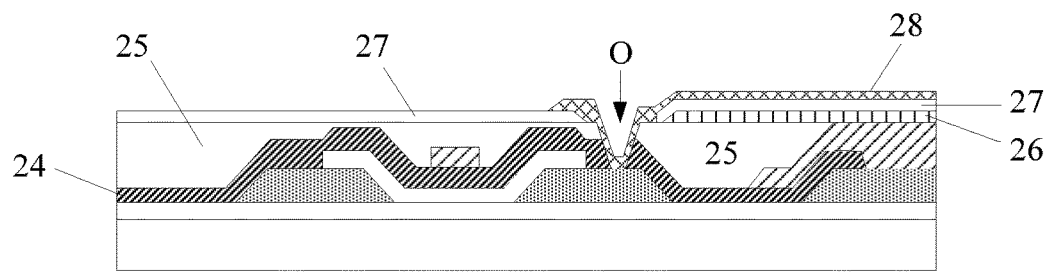
FIG. 6 is a schematic diagram of forming a pixel electrode of a manufacturing method of the present invention.

As shown in FIG. 6, the manufacturing method of the embodiment of the present invention also comprises the following steps:

providing a contact hole O in the insulating layer 24 in order to expose a surface of the drain electrode D;

forming a planar layer 25 on the substrate 21 including the gate electrode G, and forming a contact hole O in the planar layer 25 in order to expose the surface of the drain electrode D, wherein the present embodiment could use a third photo mask to obtain the contact hole O through processes of exposure, development and etching;

forming a common electrode layer 26 of the LTPS array substrate on the planar layer 25 except for a portion corresponding to the TFT, wherein the present embodiment uses a fourth photo mask to obtain a common electrode layer 26 having a predetermined pattern through processes of exposure, development and etching;

forming a passivation layer 27 on the planar 25 and the common electrode layer 26, in such a way that the passivation layer 27 does not cover the contact hole O, wherein the present embodiment uses a fifth photo mask to obtain the passivation layer 27 having a predetermined pattern through processes of exposure, development and etching and certainly, the present embodiment can also use methods, such as chemical vapor deposition, plasma chemical vapor deposition, sputtering, vacuum vapor deposition and low pressure chemical vapor deposition, to directly form the passivation layer 27 having the predetermined pattern; and forming a pixel electrode 28 on the passivation layer 27, such that the pixel electrode 28 is electrically connected with the drain electrode D through the contact hole O, wherein the present embodiment can use the sixth photo mask to obtain the pixel electrode 28 having a predetermined pattern through processes of exposure, development and etching and further, the gate electrode G of the TFT is electrically connected with the gate line formed on the substrate 21 (LTPS array substrate); the source electrode S of the TFT is electrically connected with the data line formed on the LTPS array substrate; and the gate line and the data line intersect perpendicularly to form the pixel display area where the pixel electrode 28 is located.

The embodiment of the present invention further provides a liquid crystal display panel and a liquid crystal display, which have the LTPS array substrate as shown in FIG. 6, which have the same benefits.

Based on this, the preferred embodiments according to the present invention are mentioned above, which cannot be used to define the scope of the right of the present invention. Those variations of equivalent structure or equivalent process according to the present specification and the drawings or directly or indirectly applied in other areas of technology are considered encompassed in the scope of protection defined by the claims of the present invention.

What is claimed is:

1. A low temperature poly-silicon (LTPS) array substrate, comprising:
    a substrate;
    a source electrode and a drain electrode, which are arranged on the substrate;
    a poly-silicon layer, which is arranged on the substrate including the source electrode and the drain electrode, wherein the poly-silicon layer partially covers the source electrode and the drain electrode;
    an insulating layer, which is arranged on the poly-silicon layer and the source and drain electrodes, wherein the insulating layer is formed through passivation of a part of the poly-silicon layer that covers the substrate including the source electrode and the drain electrode;
    a gate electrode, which is arranged on the insulating layer between the source electrode and the drain electrode, wherein the source and drain electrodes, the poly-silicon layer, and the gate electrode collectively form a thin-film transistor (TFT);
    a planar layer, which is arranged on the substrate including the gate electrode, wherein the planar layer is formed with a contact hole extending therethrough to expose a surface of the drain electrode;
    a common electrode, which is arranged on the planar layer except the TFT of the LTPS array substrate;
    a passivation layer, which is arranged on the planar layer and the common electrode layer, such that the passivation layer does not cover the contact hole;
    a pixel electrode, which is arranged on the passivation layer, wherein the pixel electrode is electrically connected with the drain electrode through the contact hole;
    wherein the poly-silicon layer has a first region that is stacked atop and covers an inner part of each of the source electrode and the drain electrode and a portion of the substrate that is between the source electrode and the drain electrode and a second region that is integrally extended from the first region and is partly stacked atop and covers an outer part of each of the source electrode and the drain electrode; and
    wherein the first region of the poly-silicon has a thickness that is greater than a thickness of the second region of the poly-silicon and the first region of the poly-silicon has a lower part in direct contact with the inner parts of the source electrode and the drain electrode and the portion of substrate between the source electrode and the drain electrode and an upper part that forms a first portion of the insulating layer; and the second region of the poly-silicon, in the entirety thereof, forms a second portion of the insulating layer that integrally extends from the first portion of the insulating layer, such that the insulating layer is integrally combined with the lower part of the poly-silicon layer and is extended to cover the source electrode and the drain electrode.

2. The LTPS array substrate as claimed in claim 1, wherein the passivation of the poly-silicon layer comprises one of oxidation treatment, nitriding treatment, and a combination thereof.

* * * * *